c

(12) United States Patent
Brown et al.

(10) Patent No.: US 11,508,636 B2
(45) Date of Patent: Nov. 22, 2022

(54) MULTI-LAYER SOLUTION BASED DEPOSITION OF DIELECTRICS FOR ADVANCED SUBSTRATE ARCHITECTURES

(71) Applicant: Intel Corporation, Santa Clara, CA (US)

(72) Inventors: Andrew Brown, Phoenix, AZ (US); Ji Yong Park, Chandler, AZ (US); Siddharth Alur, Chandler, AZ (US); Cheng Xu, Chandler, AZ (US); Amruthavalli Alur, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 999 days.

(21) Appl. No.: 16/024,697

(22) Filed: Jun. 29, 2018

(65) Prior Publication Data

US 2020/0006180 A1   Jan. 2, 2020

(51) Int. Cl.
| | | |
|---|---|---|
| *H01L 23/31* | (2006.01) | |
| *H01L 23/29* | (2006.01) | |
| *H01L 21/56* | (2006.01) | |
| *H01L 21/48* | (2006.01) | |
| *H01L 23/00* | (2006.01) | |
| *H01L 23/498* | (2006.01) | |

(52) U.S. Cl.
CPC ...... *H01L 23/3135* (2013.01); *H01L 21/4857* (2013.01); *H01L 21/565* (2013.01); *H01L 21/568* (2013.01); *H01L 23/295* (2013.01); *H01L 23/49822* (2013.01); *H01L 24/19* (2013.01); *H01L 24/20* (2013.01); *H01L 24/13* (2013.01); *H01L 24/32* (2013.01); *H01L 24/48* (2013.01)

(58) Field of Classification Search
CPC . H01L 21/4857; H01L 21/565; H01L 21/568; H01L 2224/16227; H01L 2224/32225; H01L 2224/48227; H01L 2224/73267; H01L 2224/83101; H01L 2224/92244; H01L 23/295; H01L 23/3135; H01L 23/49822; H01L 24/13; H01L 24/16; H01L 24/19; H01L 24/20; H01L 24/32; H01L 24/48; H01L 2924/00014; H01L 2924/15311
See application file for complete search history.

(56) References Cited

U.S. PATENT DOCUMENTS

| | | | | |
|---|---|---|---|---|
| 2017/0125346 A1* | 5/2017 | Liu | .................. | H01L 21/76895 |
| 2017/0271227 A1* | 9/2017 | Liao | ........................ | H01L 24/19 |
| 2018/0130749 A1* | 5/2018 | Tsai | ...................... | H01L 21/561 |
| 2018/0281374 A1* | 10/2018 | Park | .................... | H05K 3/4602 |
| 2019/0139924 A1* | 5/2019 | Chen | ...................... | H01L 24/19 |

* cited by examiner

*Primary Examiner* — Ahmed N Sefer
(74) *Attorney, Agent, or Firm* — Schwabe, Williamson & Wyatt P.C.

(57) ABSTRACT

Embodiments include an electronic package and methods of forming an electronic package. In an embodiment, the electronic package comprises a substrate, and a plurality of conductive features formed over the substrate. In an embodiment, a bilayer build-up layer is formed over the plurality of conductive features. In an embodiment, the bilayer build-up layer comprises a first dielectric layer and a second dielectric layer. In an embodiment, a surface of the first dielectric layer comprises depressions. In an embodiment, the second dielectric layer is disposed in the depressions of the surface of the first dielectric layer.

9 Claims, 6 Drawing Sheets

MULTI-LAYER SOLUTION BASED DEPOSITION OF DIELECTRICS FOR ADVANCED SUBSTRATE ARCHITECTURES

TECHNICAL FIELD

Embodiments of the present disclosure relate electronics packaging, and more particularly, to build-up layers with improved thickness variation and C4 area thickness variation (CTV) due to the inclusion of a spun-on dielectric.

BACKGROUND

As thermal compression bonding (TCB) is introduced for the die attachment process due to tighter die placement tolerance requirements, there are new challenges faced with regards to the flatness of the substrate. The TCB bond head places the die on to the substrate for bonding, and the substrate is secured to the pedestal through an applied vacuum pulling the back side of the substrate. As the vacuum pulls the bottom surface of the substrate flat, the top surface of the substrate may remain non-planar. The lack of a planar surface is inherent to the substrate thickness variation. With respect to the C4 area, the thickness variation may be referred to as CTV. CTV is a key to the success of the TCB process.

However, it is quite challenging to meet the CTV requirement due to inherent substrate manufacturing variance associated with organic film-based lamination process. For example, the underlying design of conductive features, and high layer counts can negatively affect CTV. Furthermore, CTV specifications will be further tightened with smaller bump pitch. Conventional solutions to improve CTV result negatively in dielectric thickness variation in the layers of the substrate package. Dielectric thickness variation (i.e., the variation of the thickness of the dielectric layer over conductive features) negatively affects the performance of the device. For example, high dielectric thickness variation negatively alters electrical performance.

EMBODIMENTS OF THE PRESENT DISCLOSURE

Described herein are electronic packages with bilayer build-up layers and methods of forming such packages. In the following description, various aspects of the illustrative implementations will be described using terms commonly employed by those skilled in the art to convey the substance of their work to others skilled in the art. However, it will be apparent to those skilled in the art that the embodiments of present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order not to obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

As noted above, the use of thermal compression bonding (TCB) processes for die attachment processes requires stringent CTV values. However, attempts to improve CTV result in increased dielectric thickness variation. Typical build-up layer lamination processes are generally a two stage process. An example, of the process is shown in FIGS. 1A and 1B.

Figure 1A:
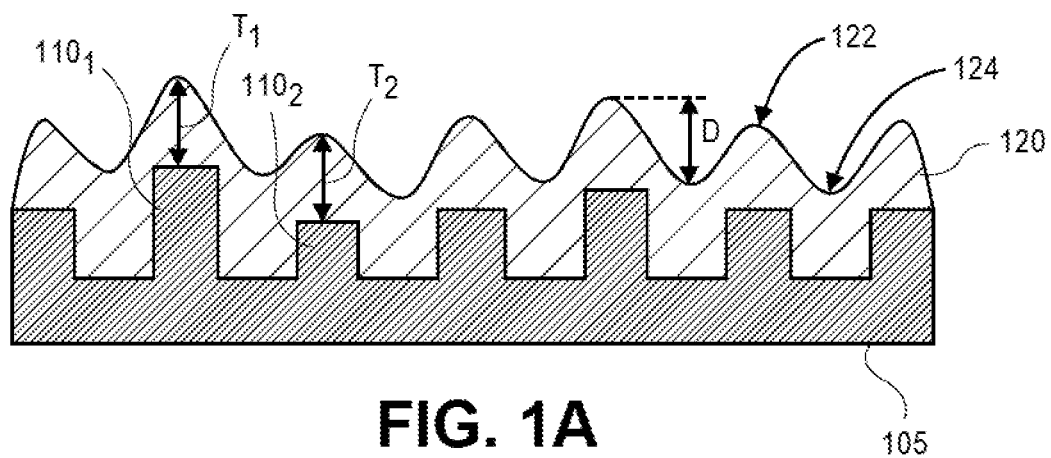
FIG. 1A is a cross-sectional illustration of a build-up layer formed over a substrate after a first stage of a lamination process.

Referring now to FIG. 1A, a conformal material vacuum laminates a dielectric film 120 over an underlying substrate 105 that comprises conductive features 110. Variation in the thickness of the conductive features 110 is inherent in the process used to form the conductive features. For example, conductive feature $110_1$ has a greater thickness than conductive feature $110_2$. During the first conformal lamination operation, the dielectric layer 120 fills gaps between the conductive features 110 and is formed above the conductive features 110. The conformal lamination process restricts the resin from flowing in the XY-direction. Accordingly, the dielectric thickness uniformity above each of the conductive features 110 is high. For example, a thickness $T_1$ of dielectric material over the first conductive feature $110_1$ is substantially equal to a thickness $T_2$ of dielectric material over the second conductive feature $110_2$ despite the differences in the thicknesses of the first conductive feature $110_1$ and the second conductive feature $110_2$.

However, since the dielectric resin does not flow in the XY-direction, the dielectric resin exhibits a non-planar surface. For example, the dielectric resin may include local maxima 122 and local depressions 124. The local depressions 124 are formed above the spacing between conductive features 110, and the local maxima 122 are formed over the conductive features 110. In some instances a difference D between the local maxima 122 and the local depressions 124 may be 10 microns or more. Accordingly, the panel flatness (i.e., CTV) is poor.

Figure 1B:
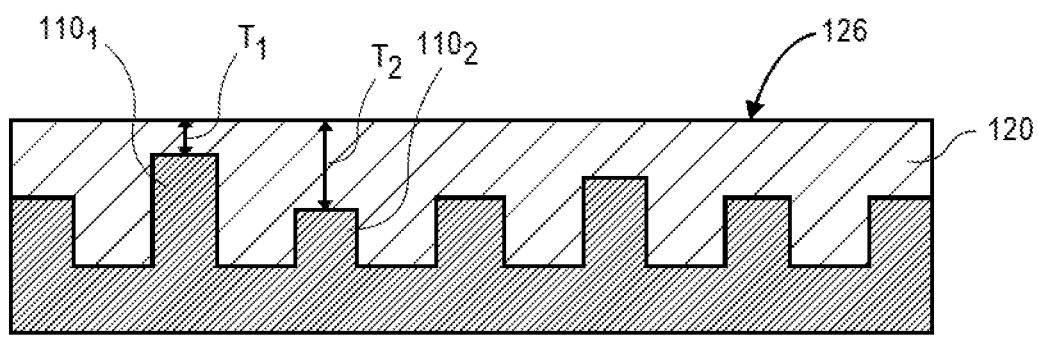
FIG. 1B is a cross-sectional illustration of the build-up layer after a second stage of a lamination process.

Referring now to FIG. 1B, a cross-sectional illustration after a second pressing operation is implemented in order to improve CTV. The second pressing operation comprises a non-conformal stainless steel plate that presses the local maxima 122 of the dielectric resin at high temperatures and induces flow in the XY-direction in order to minimize the presence of local maxima 122 and local depressions 124. As such, the CTV of pressed surface 126 is improved compared to the surface prior to the second pressing operation. However, the second pressing operation significantly reduces the dielectric thickness uniformity. As shown, the thickness $T_1$ of dielectric material over the first conductive feature $110_1$ is significantly smaller than the thickness $T_2$ of dielectric material over the second conductive feature $110_2$. There are no existing solutions that improve both CTV and dielectric thickness variation. As shown in FIGS. 1A and 1B, improvements to CTV negatively impact the thickness variation, and vice versa.

Accordingly, embodiments described herein include methods of forming a bilayer build-up layer that provides improvement to the CTV without negatively affecting the dielectric thickness variation. In some embodiments, the CTV may be further improved with a subsequent pressing operation. However, it is to be appreciated that while the pressing operation significantly improves the CTV, the negative affect to the dielectric thickness variation is minimized.

Particularly, embodiments described herein comprise modifying the conventional lamination process described above by replacing the second stage pressing operation with a spin coating operation or a slit coating operation. In an embodiment, a liquid type resin is deposited over the surface of the first dielectric layer that was laminated with the conformal pressing operation. In an embodiment, the liquid resin fills the depressions in the surface of the first dielectric created by the first conformal vacuum pressing operation. This results in a flat surface with a uniform dielectric thickness above the conductive features.

Accordingly, embodiments provide build-up layers that are capable of scaling to more stringent design rules. For example, the improved thickness variation will allow for improved electrical performance of the package substrate. Typical concerns related to thickness variation (e.g., impedance, cross-talk, return loss, etc.) are mitigated by the use of a bilayer build-up structure described herein. As such, disruptive technologies (e.g., planarization and grinding) are not needed to provide the desired thickness variation. Furthermore, embodiments enable CTV that is suitable for use with bump pitch design rules for silicon (e.g., 55 micron) and even allows for further scaling to bump pitches of 45 microns or less. For example, the CTV may be 5 μm or less.

Figure 2A:
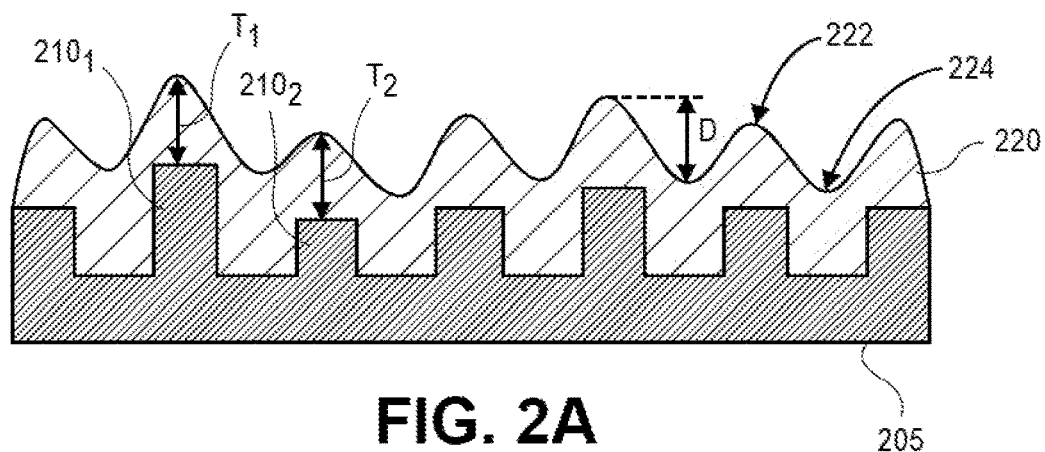
FIG. 2A is a cross-sectional illustration of a first dielectric layer formed over a substrate with conductive features after a first stage of a lamination process, in accordance with an embodiment.

Referring now to FIG. 2A, a cross-sectional illustration after a first dielectric layer 220 is formed over a substrate 205 is shown, in accordance with an embodiment. In an embodiment, the substrate 205 may be any substrate for use in electronics packaging. For example, the substrate 205 may be a dielectric layer or the like. In an embodiment, the plurality of conductive features 210 may be formed over the substrate 205. The conductive features 210 may comprise traces, pads, power planes, or any other conductive feature. In an embodiment, the conductive features 210 may be formed with any line width and spacing. For example, the line widths may be 10 microns or less and the line spacing may be 15 microns or less. However, it is to be appreciated that embodiments may comprise conductive features with any line width and/or spacing.

In an embodiment, the conductive features 210 may have a non-uniform thickness. For example, thickness variation of the conductive features 210 may be inherent to processing operations used to form the conductive features. In a particular example, a first conductive feature $210_1$ may have a greater thickness than a second conductive feature $210_2$.

In an embodiment, the first dielectric layer 220 may be formed over the substrate 205 and the conductive features 210. In an embodiment, the first dielectric layer 210 may be disposed over the substrate 205 and the conductive features with a lamination process that comprises a first stage press that includes a conformal vacuum lamination. In such embodiments, the first dielectric layer 210 may be confined to displacement in only the Z-direction (i.e., the first dielectric 210 does not flow in the XY-directions). Accordingly, embodiment include a first dielectric layer 210 that has a uniform dielectric thickness variation over the conductive features 210. For example, the thickness $T_1$ of the first dielectric over the first conductive feature $210_1$ is substantially equal to the thickness $T_2$ of the first dielectric over the second conductive feature $210_2$.

While the first stage pressing operation provides a uniform dielectric thickness variation over the conductive features 210, it is to be appreciated that the CTV of the first dielectric layer 210 is not optimal. Particularly, embodiments may include a non-planar surface that comprises plurality of local maxima 222 and local depressions 224. The non-planar surface may be attributable to the density variation of the underlying conductive features 210. For example, the local maxima 222 may be located above conductive features 210, and the local depressions 224 may be located above the spacing between conductive features 210. In an embodiment, the difference D between the local maxima 222 and the neighboring local depressions 224 may be 10 microns or greater.

Figure 2B:
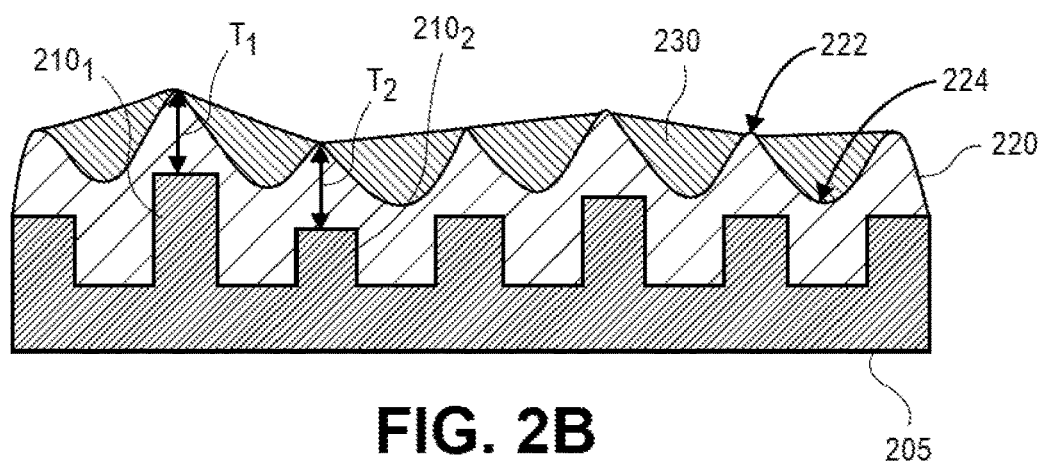
FIG. 2B is a cross-sectional illustration after a second dielectric layer is disposed over the first dielectric layer, in accordance with an embodiment.

Referring now to FIG. 2B, a cross-sectional illustration after a second dielectric layer 230 is disposed over the first dielectric layer 220 is shown, in accordance with an embodiment. In an embodiment, the second dielectric layer 230 may be preferentially disposed into the depressions 224 of the first dielectric layer 230. In an embodiment, the second dielectric layer 230 may be preferentially disposed into the depressions 224 with a spin-on process. In an embodiment, the second dielectric layer 230 may be a low viscosity material that will flow and fill the depressions 224. In an embodiment, the spin-coating process may be implemented at the panel level, at the quarter panel level, or at any other desired size. In an additional embodiment, the second dielectric layer 230 may also be disposed with a slit coating process that utilizes a low viscosity material.

As illustrated in FIG. 2B, the locations above the conductive features 210 (i.e., local maxima 222) remain unchanged by the deposition of the second dielectric layer 230. Accordingly, the thickness uniformity, as measured by via depth, remains unchanged following the conformal press illustrated in FIG. 1A. Furthermore, filling the depressions 224 improves the CTV compared to the only the use of the first dielectric 220, as illustrated in FIG. 2A. For example, the CTV in FIG. 2B may be less than 10 μm, whereas the CTV illustrated in FIG. 2A may be greater than 10 μm In an embodiment, the low viscosity material used for the second dielectric layer 230 may be cured subsequent to being disposed over the first dielectric 220. For example, the curing temperature may be approximately 200° C. or less. In an embodiment, the curing temperature may be approximately 180° C. or less. Additional embodiments may comprise a low viscosity material for the second dielectric layer 230 that has a dielectric constant that is similar to the dielectric constant of the underlying first dielectric layer 220. For example, a dielectric constant of the second dielectric layer 230 may be 5 or less. In an embodiment, sufficient amounts of the second dielectric layer 230 may be formed over the first dielectric 220 so that only the second dielectric layer 230 is exposed. For example, the second dielectric layer 230 may completely fill the depressions 224 and be formed above local maxima 222 as well. In such embodiments, subsequent processing (e.g., desmear) may be improved since only a single material is exposed.

It is to be appreciated that the use of a second dielectric layer 230 that has a low viscosity to fill the depressions 224 with either spin coating or slit coating processes is distinct from currently available liquid solder resists. Particularly, liquid solder resists are disposed over dielectric surfaces that do not have significant local maxima and local depressions since the underlying dielectric layer has been pressed with a hot pressing operation similar to what is shown in FIG. 1B above. As such, there are no depressions that confine the flow of liquid solder resists and inadvertent flow of the liquid solder resists cannot be easily prevented. Additionally, the pressure uniformity in roll coating equipment (used for deposition of liquid solder resists) is dependent on thickness uniformity of the panel and other factors that inhibit good thickness variation.

Figure 2C:
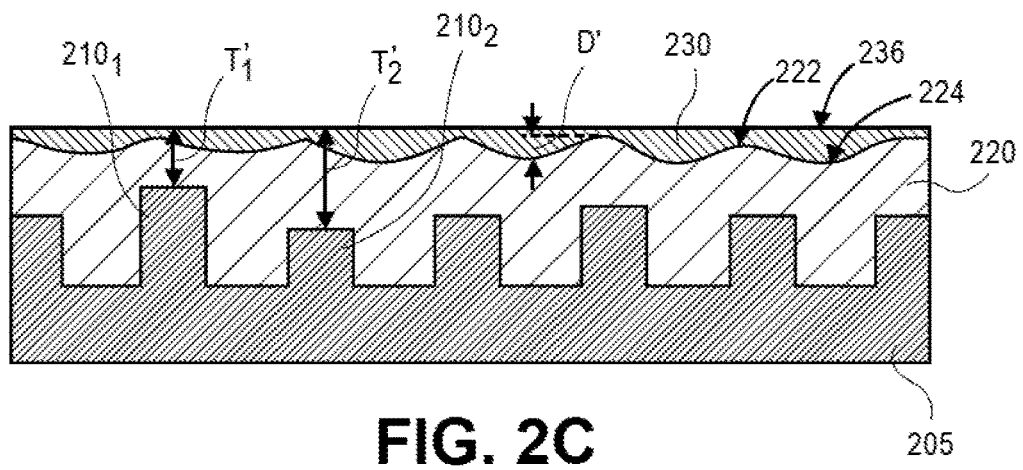
FIG. 2C is a cross-sectional illustration after the second dielectric layer and the first dielectric layer are pressed to form a bilayer build-up layer with improved CTV, in accordance with an embodiment.

Referring now to FIG. 2C, a cross-sectional illustration after a pressing operation is shown, in accordance with an embodiment. In an embodiment, the pressing operation may optionally be used to improve the CTV of the bilayer build-up layer comprising the first dielectric layer 220 and the second dielectric layer 230. In an embodiment, the pressing operation may comprise a pressing operation that utilizes a non-conformal plate (e.g., a stainless steel plate). In an embodiment, the pressing operation may be implemented with a heated plate. In an embodiment, the CTV of the bilayer build-up layer may be improved compared to the CTV illustrated in FIG. 2B. In a particular embodiment, the CTV illustrated in FIG. 2C may be 5 μm or less.

As illustrated in FIG. 2C, the pressing operation provides a substantially planar top surface 236 of the second dielectric 230. However, it is to be appreciated that the dielectric thickness variation is changed by the pressing operation as well. For example, the total dielectric thickness $T'_1$ over the first conductive feature $210_1$ is now different than the total dielectric thickness $T'_2$ over the second conductive feature $210_2$. This thickness variation, however, is not nearly as severe as seen in a pressing operation where a second dielectric layer 230 is not present. In an embodiment, the pressing operation may reduce the difference between the local maxima 222 and the local depressions 224. For example, the difference D' between a local maxima 222 and the neighboring local depression 224 may be 10 microns or less. In an embodiment, the difference D' may be 5 microns or less.

Figure 3:
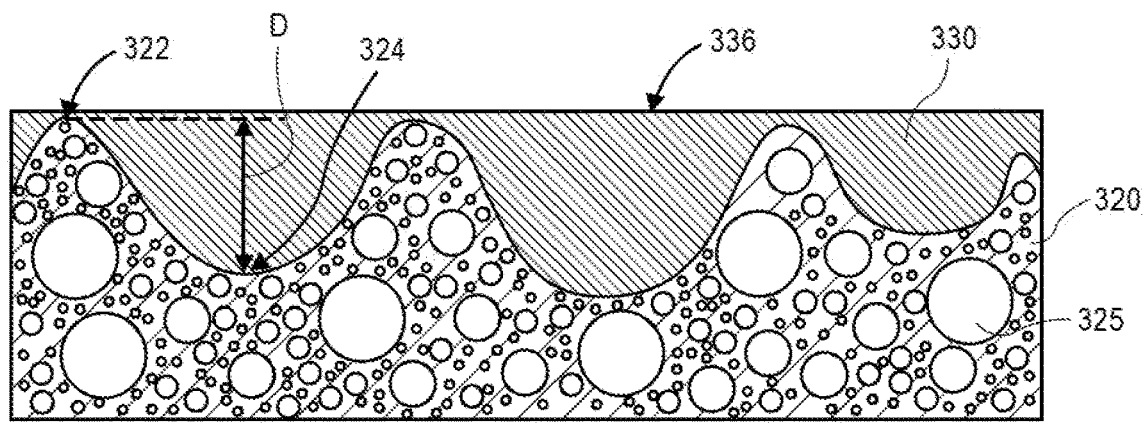
FIG. 3 is a cross-sectional illustration of a bilayer build-up layer, in accordance with an embodiment.

Referring now to FIG. 3, a cross-sectional illustration of an example of the interface between the first dielectric layer 320 and the second dielectric layer 330 is shown in accordance with an embodiment. As illustrated, cross-sectional analysis (e.g., a scanning electron micrograph (SEM) or tunneling electron micrograph (TEM)) of a package substrate will clearly disclose the presence of a bilayer build-up layer formed in accordance with embodiments described herein. One indication of the use of a bilayer build-up layer is the difference in materials between the first dielectric layer 320 and the second dielectric layer 330. For example, the first dielectric layer 320 may include discernable filler particles 325 of 1 micron or greater in diameter, and the second dielectric layer 330 may have no filler particles 325 or the second dielectric layer 330 may have smaller and/or fewer filler particles 325 than the first dielectric layer 320. Additionally, embodiments formed in accordance with embodiments described herein may exhibit local maxima 322 and local depressions 324 in the first dielectric layer 330. In an embodiment the difference D between the local maxima 322 and neighboring local depressions 324 may be approximately 10 microns or less, or 5 microns or less.

Figure 4:
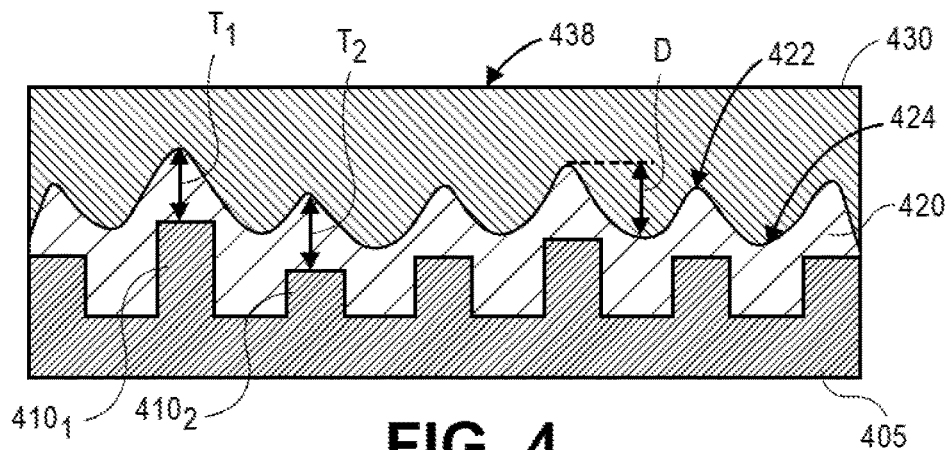
FIG. 4 is a cross-sectional illustration of a bilayer build-up layer with a second dielectric layer that has a thickness sufficient to provide improved CTV without a pressing process, in accordance with an embodiment.

Referring now to FIG. 4, a cross-sectional illustration of a bilayer build-up layer is shown, in accordance with an additional embodiment. In an embodiment, the bilayer is similar to the bilayer illustrated in FIG. 2B, with the exception that the second dielectric layer 430 has a greater thickness. Increasing the thickness of the second dielectric layer 430 may provide an improved CTV without the need for a pressing operation. For example, the CTV is improved despite the difference D between the local maxima 422 and the local depressions 424 remaining unchanged after the first conformal vacuum deposition of the first dielectric layer 420.

Figure 5:
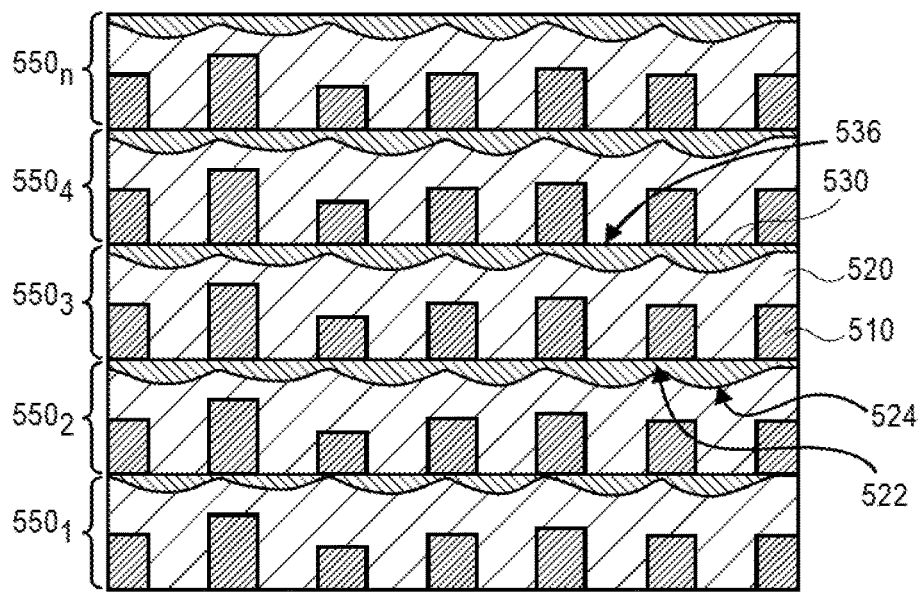
FIG. 5 is a cross-sectional illustration of a plurality of bilayer build-up layers in a stacked configuration, in accordance with an embodiment.

While a single bilayer build-up layer is shown in FIGS. 2A-4, it is to be appreciated that embodiments include any number of bilayer build-up layers stacked over each other. An example of such an embodiment is shown in FIG. 5. In FIG. 5, a plurality of bilayer build-up layers 550 are shown, in accordance with an embodiment. In the illustrated embodiment, five bilayers $550_1$-$550_n$ are shown. However, it is to be appreciated that any number of bilayers 550 may be used depending on the needs of the device. Each of the bilayers 550 may comprise a first dielectric layer 520 and a second dielectric layer 530. In an embodiment, the second dielectric layer 530 may fill local depressions 522 in the first dielectric layer. In an embodiment, conductive features 510 in the next bilayer 550 may be formed over the uppermost surface 536 of the second dielectric layer 530 in the underlying bilayer 550. While not illustrated in FIG. 5, it is to be appreciated that vias may be formed through the bilayers 550 to provide electrical connections between conductive features 510 in different bilayers 550.

Electronic package substrates with a plurality of bilayer build-up layers 550 such as those disclosed in embodiments described herein may be used in server applications, high performance computing applications, 5G applications, or any other electronic packaging that requires high CTV and optimal dielectric thickness variation. In an embodiment, electronic package substrates with a plurality of bilayer build-up layers 550 such as those described herein may be used in applications where a die is bonded to the package substrate with a thermal compression bonding (TCB) process.

While embodiments described above comprise bilayer build-up layers for packaging substrates, it is to be appreciated that embodiments are not limited to such applications. For example, bilayers may be used in applications such as die first fan-out applications. An example of such an embodiment is shown in FIG. 6.

Figure 6:
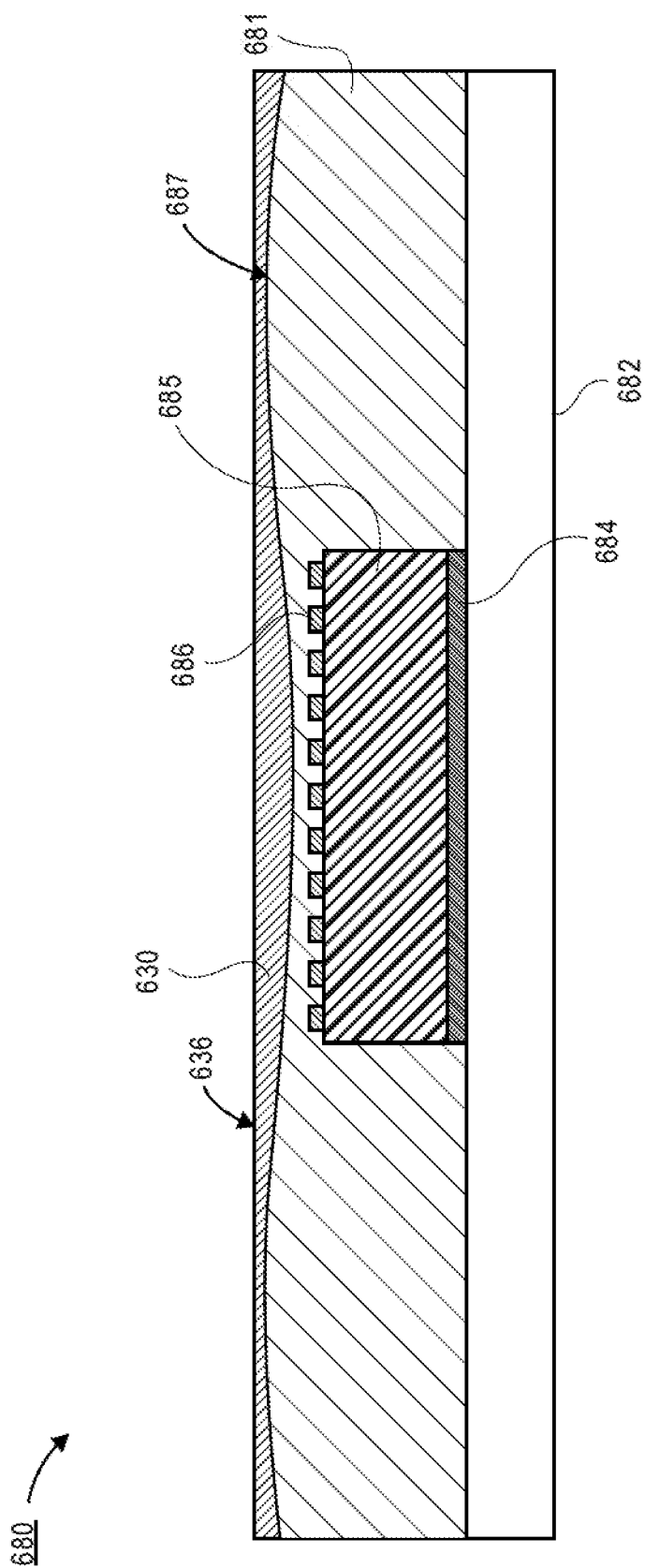
FIG. 6 is a cross-sectional illustration of a die embedded within a first mold layer, where a second mold layer is formed over the first mold layer, in accordance with an embodiment.

Referring now to FIG. 6, a cross-sectional illustration of a die first fan-out package 680 is shown, in accordance with an embodiment. In an embodiment, the die 685 may be mounted to a carrier 682. In an embodiment, the die 685 may be coupled to the carrier 682 by a die attach film (DAF) 684. In an embodiment, the curing process used to cure the DAF 684 may result in die warpage. Accordingly, when a first mold layer 681 is formed over and around the die 682, the first mold layer 681 may comprise a surface 687 that is non-planar. For example, the first mold layer 681 may comprise a depression formed over the die 682. The depression over the die 682 may be problematic due to different mold thicknesses formed over the contacts 686 of the die 682. Accordingly, embodiments may include a second mold layer 630 formed over the first mold layer 681. In an embodiment, the second mold layer 630 may be a low viscosity material that is disposed over the first mold layer 681 with a spin-on process or a slit coating process. Accordingly, the second mold layer 630 will preferentially fill the depressions in the surface 687 of the first mold layer 681. As such, a dielectric thickness of molding material (i.e., the combined thickness of the first mold layer 681 and the second mold layer 630) over each of the contacts 686 may be substantially uniform. In an embodiment, a pressing operation may also be implemented to improve the CTV of surface 636 of the second mold layer 630. A pressing process may reduce the mold layer thickness uniformity, but the improvement to CTV may be a worthwhile tradeoff.

Figure 7:
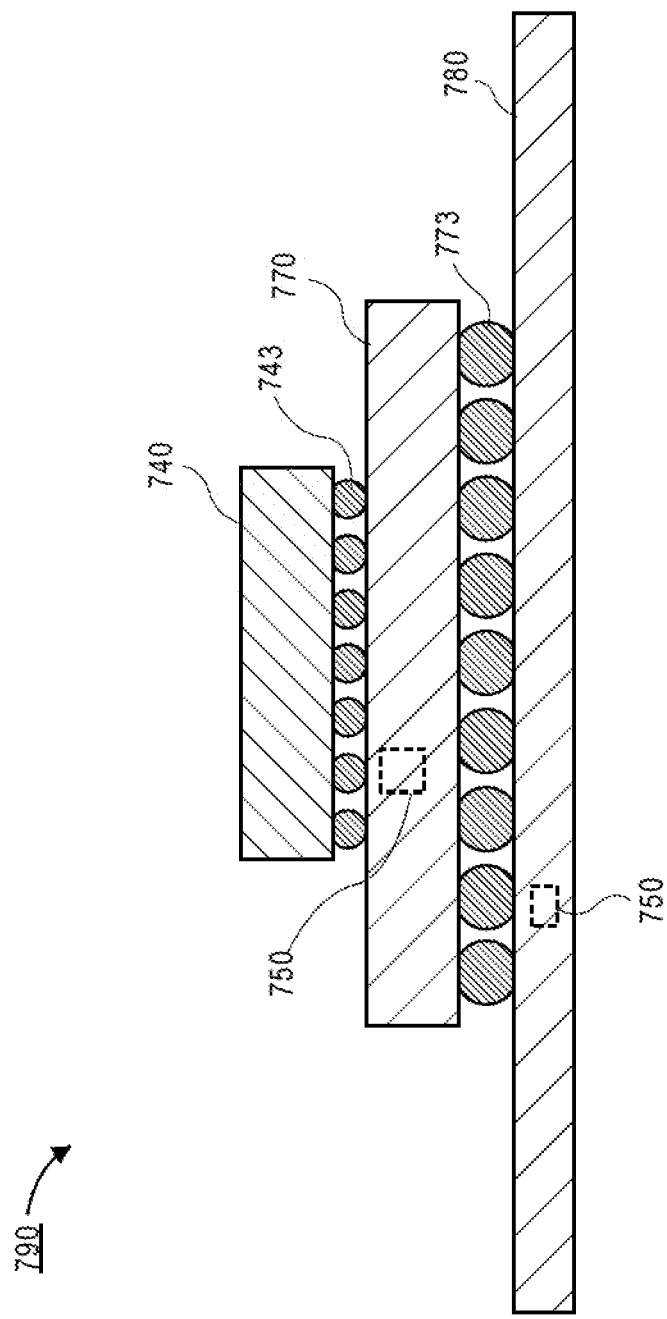
FIG. 7 is a cross-sectional illustration of an electronic package that includes a bilayer build-up layer, in accordance with an embodiment.

Referring now to FIG. 7, a cross-sectional illustration of a packaged system 790 is shown, in accordance with an embodiment. In an embodiment, the packaged system 790 may include a die 740 electrically coupled to a package substrate 770 with solder bumps 743. In additional embodiments, the die 740 may be electrically coupled to the package substrate 770 with any suitable interconnect architecture, such as wire bonding or the like. The package substrate 770 may be electrically coupled to a board, such as a printed circuit board (PCB) 780 with solder bumps 773 or any other suitable interconnect architecture, such as wire bonding or the like.

In an embodiment, a bilayer build-up layer 750 a similar to embodiments described above may be integrated into the package substrate 770 or the board 780, or the package substrate 770 and the board 780. Embodiments include any number of bilayer build-up layers 750 formed into the package substrate 770 and the board 780. For example, a plurality of bilayer build-up layers 750 may be integrated into the package substrate 770 or the board 780, or the package substrate 770 and the board 780.

Figure 8:
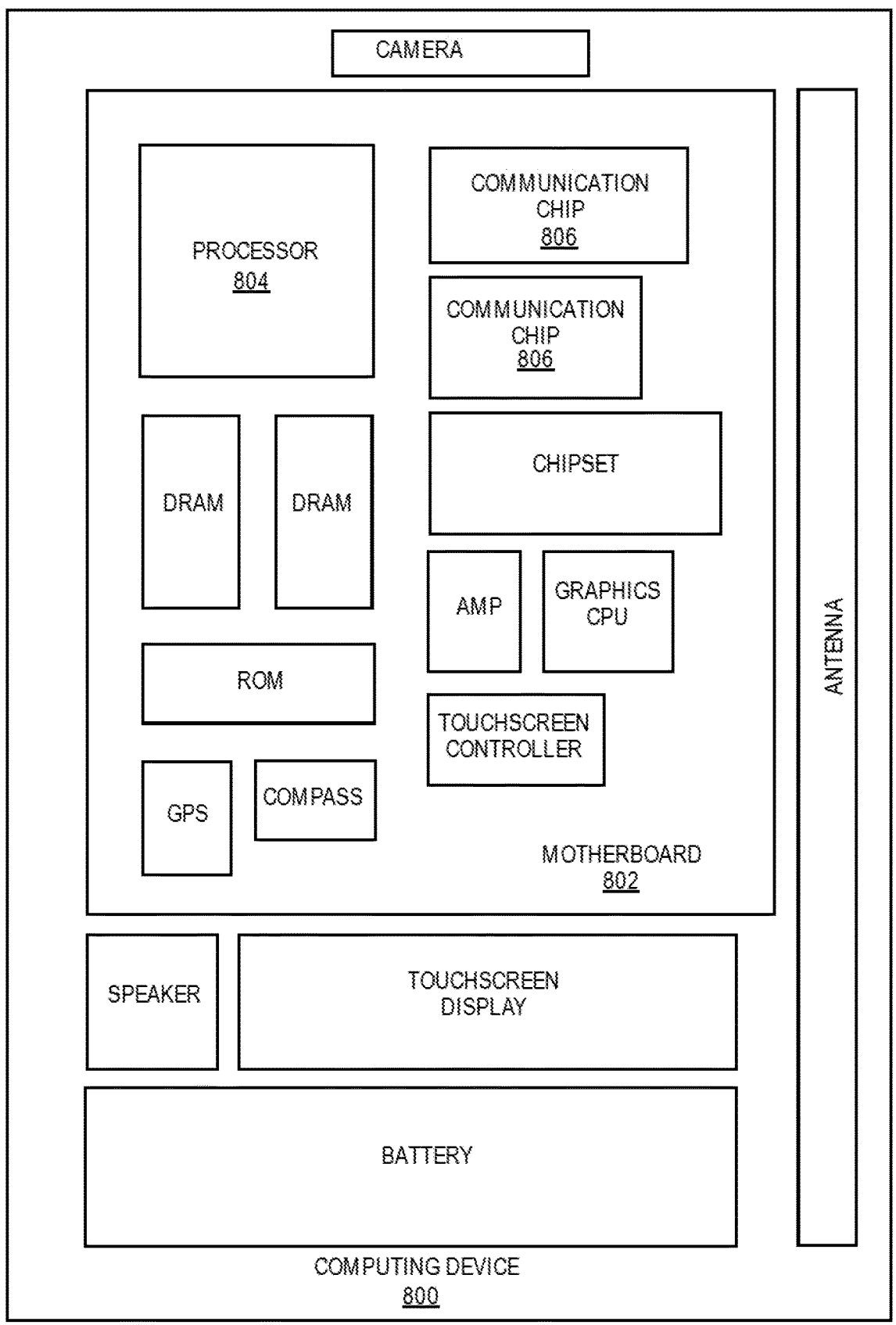
FIG. 8 is a schematic of a computing device built in accordance with an embodiment.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor may be communicatively coupled to an organic electronic package that includes a bilayer build-up layer, in accordance with embodiments described herein. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip may be communicatively coupled to an organic electronic package that includes a bilayer build-up layer, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate; a plurality of conductive features formed over the substrate; and a bilayer build-up layer formed over the plurality of conductive features, wherein the bilayer build-up layer comprises: a first dielectric layer, wherein a surface of the first dielectric layer comprises depressions; and a second dielectric layer in the depressions of the surface of the first dielectric layer.

Example 2: the electronic package of Example 1, wherein depressions in the first dielectric layer are located between the conductive features formed over the substrate.

Example 3: the electronic package of Example 1 or Example 2, wherein the second dielectric layer completely fills the depressions of the first dielectric layer.

Example 4: the electronic package of Examples 1-3, wherein a depth of the depressions are approximately 10 microns or less.

Example 5: the electronic package of Examples 1-4, wherein the depth of the depressions are approximately 5 microns or less.

Example 6: the electronic package of Examples 1-5, wherein a surface of the second dielectric has a C4 area thickness variation (CTV) of 10 microns or less.

Example 7: the electronic package of Examples 1-6, wherein the second dielectric is a spun on dielectric.

Example 8: the electronic package of Examples 1-7, wherein the first dielectric comprises filler particles.

Example 9: the electronic package of Examples 1-8, further comprising a plurality of bilayer build-up layers formed over the substrate.

Example 10: a method of forming an electronic package, comprising: forming a plurality of conductive features over a substrate; disposing a first dielectric layer over the plurality of conductive features, wherein the first dielectric layer comprises a plurality of local maxima and local depressions, wherein the local maxima are positioned over the conductive features, and wherein the local depressions are located between conductive features; and disposing a second dielectric layer over the first dielectric layer, wherein the second dielectric layer fills the local depressions.

Example 11: the method of Example 10, further comprising: pressing the second dielectric layer, wherein the pressed second dielectric layer has a C4 area thickness variation (CTV) that is 5 microns or less.

Example 12: the method of Example 10 or Example 11, wherein the local depressions have a depth of approximately 10 microns before pressing the second dielectric layer, and wherein the depth of the depressions are reduced after the pressing.

Example 13: the method of Examples 10-12, wherein the second dielectric layer is dispensed over the first dielectric with a spin-on process.

Example 14: the method of Examples 10-13, wherein the first dielectric layer comprises filler particles.

Example 15: the method of Examples 10-14, wherein the first dielectric is laminated over the conductive features, and wherein the lamination process limits the flow of the first dielectric to the Z-direction.

Example 16: the method of Examples 10-15, wherein a thickness of the first dielectric layer over each of the conductive features is substantially equal after the first dielectric layer is formed.

Example 17: the method of Examples 10-16, further comprising: attaching a die to the electronic package with a thermal compression bonding (TCB) process.

Example 18: an electronics package, comprising: a package substrate, wherein the package substrate comprises: a plurality of bilayer build-up layers, wherein each bilayer build-up layer comprises a first dielectric layer and a second dielectric layer that is different than the first dielectric layer; and a die electrically and mechanically coupled to the package substrate.

Example 19: the electronics package of Example 18, wherein the package is a server package.

Example 20: the electronics package of Example 18 or Example 19, wherein the electronic package is an embedded multi-die interconnect bridge (EMIB) package.

Example 21: the electronics package of Examples 18-20, wherein the electronic package is a 5G package.

Example 22: the electronics package of Examples 18-21, wherein the package substrate has a C4 area thickness variation (CTV) of 10 microns or less.

Example 23: the electronics package of Examples 18-22, wherein the die is mechanically coupled to the package substrate with a thermal compression bonding (TCB) process.

Example 24: an electronics package, comprising: a mold layer; a die embedded in the mold layer, wherein a surface of the mold layer comprises a depression; a dielectric layer over the mold layer, wherein the dielectric layer is a spun-on dielectric layer that fills the depression.

Example 25: the electronics package of Example 24, wherein the depression in the mold layer is over the die.

What is claimed is:

1. An electronic package, comprising:
a substrate;
a plurality of conductive features formed over the substrate, wherein a first one of the plurality of conductive features has a first height, and a second one of the plurality of conductive features has a second height different than the first height; and
a bilayer build-up layer formed over the plurality of conductive features, wherein the bilayer build-up layer comprises:
a first dielectric layer, wherein a surface of the first dielectric layer comprises depressions, and wherein a first one of the depressions has a first depth, and a second one of the plurality of depressions has a second depth different than the first depth; and
a second dielectric layer in the depressions of the surface of the first dielectric layer.

2. The electronic package of claim 1, wherein depressions in the first dielectric layer are located between the conductive features formed over the substrate.

3. The electronic package of claim 1, wherein the second dielectric layer completely fills the depressions of the first dielectric layer.

4. The electronic package of claim 1, wherein a depth of the depressions are approximately 10 microns or less.

5. The electronic package of claim 4, wherein the depth of the depressions are approximately 5 microns or less.

6. The electronic package of claim 1, wherein a surface of the second dielectric has a C4 area thickness variation (CTV) of 10 microns or less.

7. The electronic package of claim 1, wherein the second dielectric is a spun on dielectric.

8. The electronic package of claim 7, wherein the first dielectric comprises filler particles.

9. The electronic package of claim 1, further comprising a plurality of bilayer build-up layers formed over the substrate.

* * * * *